(12) United States Patent
Van Bezooijen et al.

(10) Patent No.: US 6,233,292 B1
(45) Date of Patent: May 15, 2001

(54) DIGITAL COMMUNICATION DEVICE

(75) Inventors: Adrianus Van Bezooijen; Evert D. Van Veldhuizen, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/099,499

(22) Filed: Jun. 18, 1998

(30) Foreign Application Priority Data

Jun. 19, 1997 (EP) .................................................. 97201870

(51) Int. Cl.⁷ .................................................. H04B 14/06
(52) U.S. Cl. ........................................... 375/344; 455/264
(58) Field of Search ........................ 375/344; 455/192.1, 455/192.2, 255, 256, 257, 258, 259, 260, 264, 265

(56) References Cited

U.S. PATENT DOCUMENTS

| 4,921,467 | 5/1990 | Lax | ........................................ 455/264 |
|---|---|---|---|
| 5,113,416 | 5/1992 | Lindell | .................................... 375/97 |
| 5,172,075 | 12/1992 | Yerbury et al. | .......................... 331/14 |

FOREIGN PATENT DOCUMENTS

| 0735675A2 | 2/1996 | (EP) | .................................. H03J/7/06 |
|---|---|---|---|
| WO962498 A1 | 8/1996 | (WO) | ............................... H03L/1/02 |

*Primary Examiner*—Chi Pham
*Assistant Examiner*—Phuong Phu

(57) ABSTRACT

A digital receiver has a local oscillator that provides a local oscillator signal, a frequency offset detector that provides a frequency offset signal that is representative of a difference between the local oscillator signal and a desired tuning frequency of the digital receiver, and a frequency controller that controls the frequency of the local oscillator on the basis of a stored control value. The frequency controller separately derives a short term drift compensation signal and a long term drift compensation signal from the frequency offset signal, at a first interval updates the stored control value on the basis of the derived short term drift compensation signal, and at a second interval updates the stored control value on the basis of the long term drift compensation signal. The first interval is substantially shorter than the second interval.

10 Claims, 4 Drawing Sheets

DIGITAL COMMUNICATION DEVICE

TECHNICAL FIELD

Figure 1:
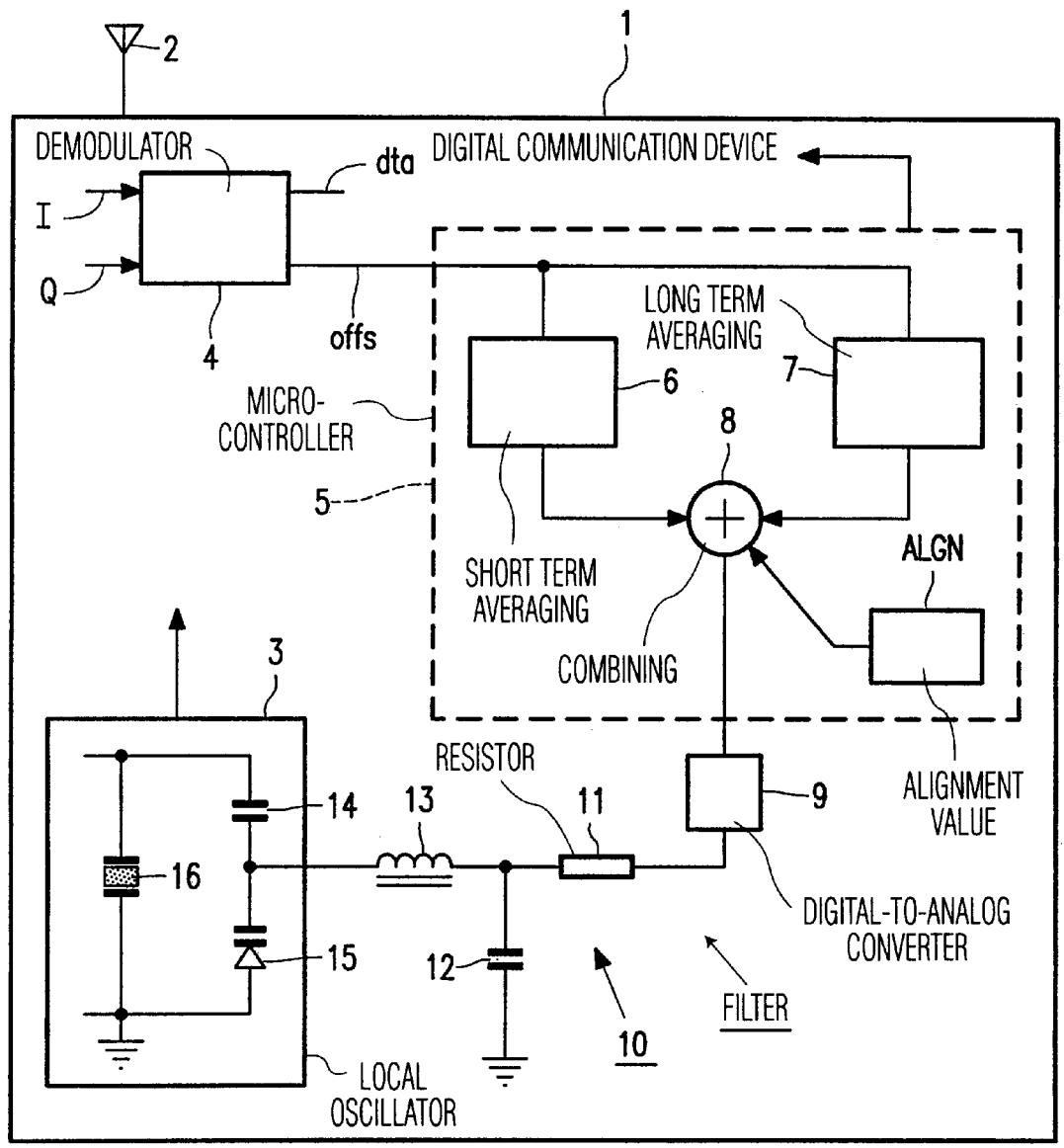

The present invention relates to a digital communication device comprising a receiver having a mixer which is coupled to a local frequency generating arrangement, a demodulator which is coupled to the receiver, a microcontroller which is coupled to the demodulator being arranged for providing a frequency offset value being a difference between a frequency value representative of an output frequency of the local frequency generating arrangement and a frequency value representative of a desired tuning frequency, and frequency adjustment means for adjusting the frequency of the local frequency generating arrangement in dependence of the frequency offset value. Such a digits communication device can be a pager, or any other suitable digital communication device such as a cellular or cordless telephone, or the like. The receiver can be a super heterodyne receiver, a direct conversion quadrature receiver, or any other suitable receiver.

BACKGROUND OF THE INVENTION

A digital communication device of this kind is known from the European Patent Application EP 0 735 675 A2. The known device comprises an automatic frequency control (AFC) loop for adjusting the frequency of a local oscillator in accordance with a frequency offset between a frequency of the local oscillator and a desired tuning frequency. In order to avoid erroneous tuning to a strong adjacent channel, in such communication devices frequency offset compensation should only be done in a limited range. The known communication device has a temperature sensor so as take into account temperature effects the AFC control loop. Such a temperature sensor renders the communication device complicated. Besides, no measures are described for taking into account long term effects such as aging. Herewith, in the long run, the communication device can run out of its specifications.

SUMMARY OF THE INVENTION

It is an object of the present invention to provide a more robust digital communication device in which both the effects of long term and short term frequency drift effects are taken into account.

To this end the communication device according to the present invention is characterised in that the microcontroller is arranged for processing the frequency offset value such that long term frequency drift is separated from short term frequency drift, whereby the frequency adjustment means comprises a frequency adjustment reference value which is updated in accordance with the separated long term frequency drift. Herewith, under all circumstances maximum freedom is achieved for compensating short frequency drift such as temperature drift or drift caused by co-channel interference. Alternatively, cost reduction can be achieved by allowing greater temperature and aging drifts. The present invention is based upon the insight to adapt the frequency adjustment reference value over a relatively long period such that it follows the long term frequency drift such as drift caused by aging effects in components of the communication device, such as a reference crystal in the local frequency generating arrangement. Also incidents causing a similar effect as aging are compensated for. Such an incident can be a sudden change in parameter values of a crystal oscillator when the receiver is subjected to a shock, e.g., by being dropped. Such a quasi short term drift will initially add to the short term offset which may be partly compensated, but will eventually be fully compensated for because in the long run it is considered by the drift compensation mechanism as a long term drift effect.

Embodiments of a digital communication device according to the present invention are given in the dependent claims. By initially aligning the frequency adjustment reference value such that the frequency affect becomes zero, it is achieved that in the factory the digital communication device is optimally aligned before being sold. By determining the short term driff and the long term drift by respective averaging of the frequency offset value over averaging periods of defferent lengths, it is achieved that a good separation is made between short term and long term drift, whereby short term averaging can be done over minutes and long term averaging can be done over months, for instance. By relating a frequency adjustment control value and the frequency adjustment reference value to each other in accordance with a predetermined function, it is achieved that a non-linear relationship or any other predetermined relationship between reference and control value is taken into account, whereas storing the predetermined function as a look-up table in the microcontroller gives an advantageous embodiment thereof. When the digital communication device is a pager, whereby the frequency offset value is determined at a synchrosinsation word received by the pager, proper measurement of the frequency offset values in a pager is achieved. Generally, the demodulator is a digital demodulator. Such demodulators have the capability to provide frequency offset values.

BRIEF DESCRIPTION OF THE INVENTION

Figure 2:
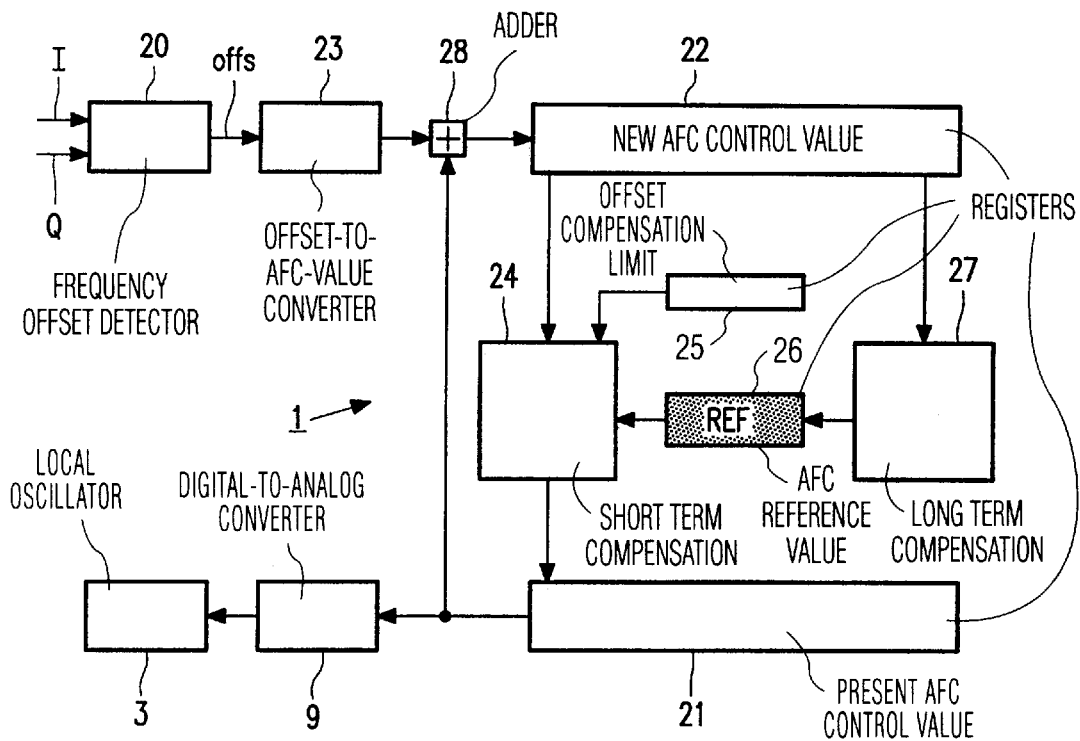
Figure 3:
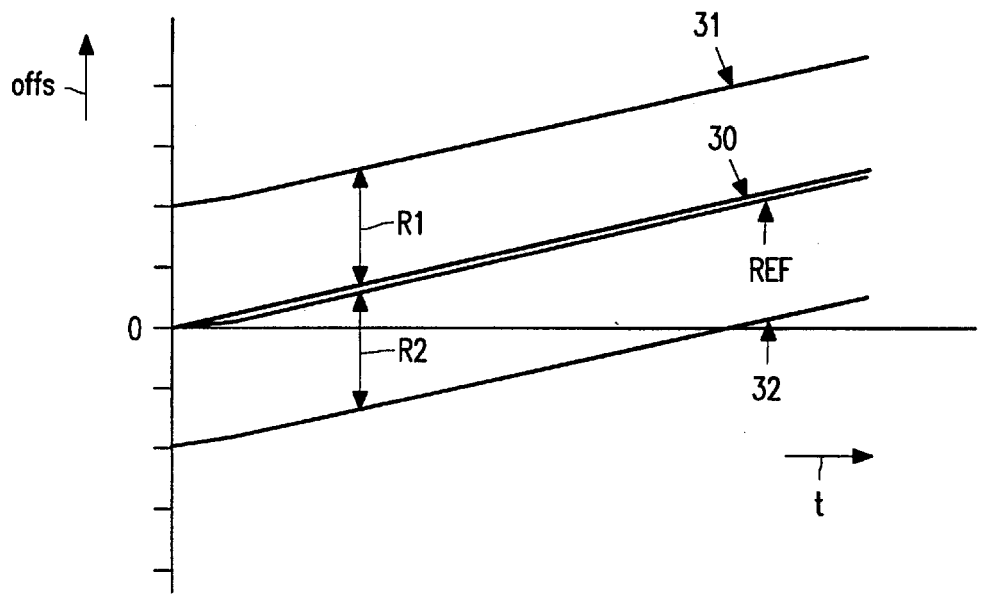
Figure 4:
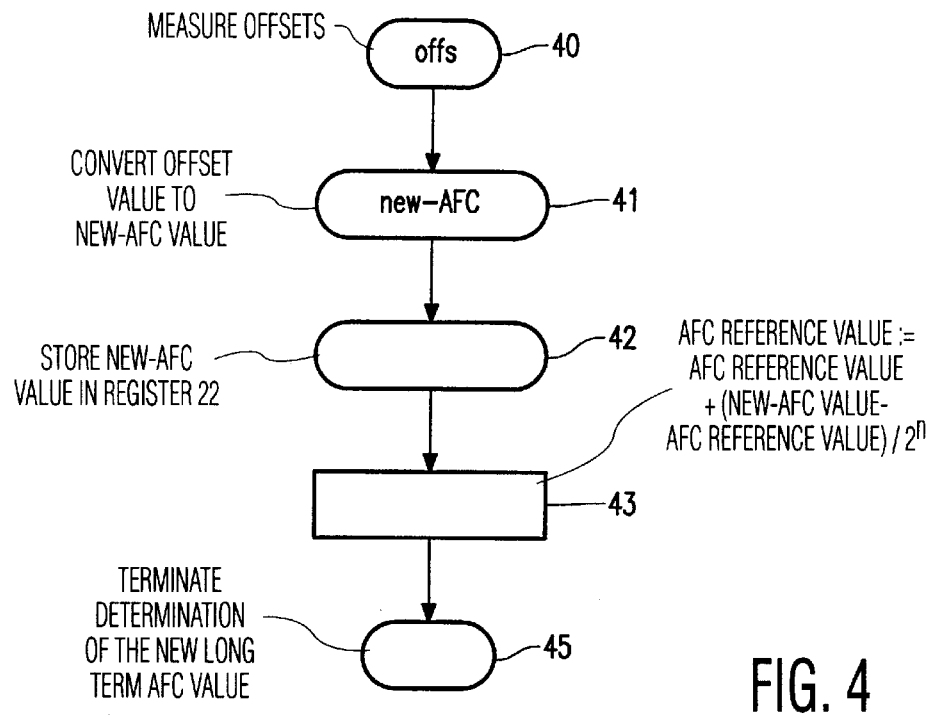
Figure 5:
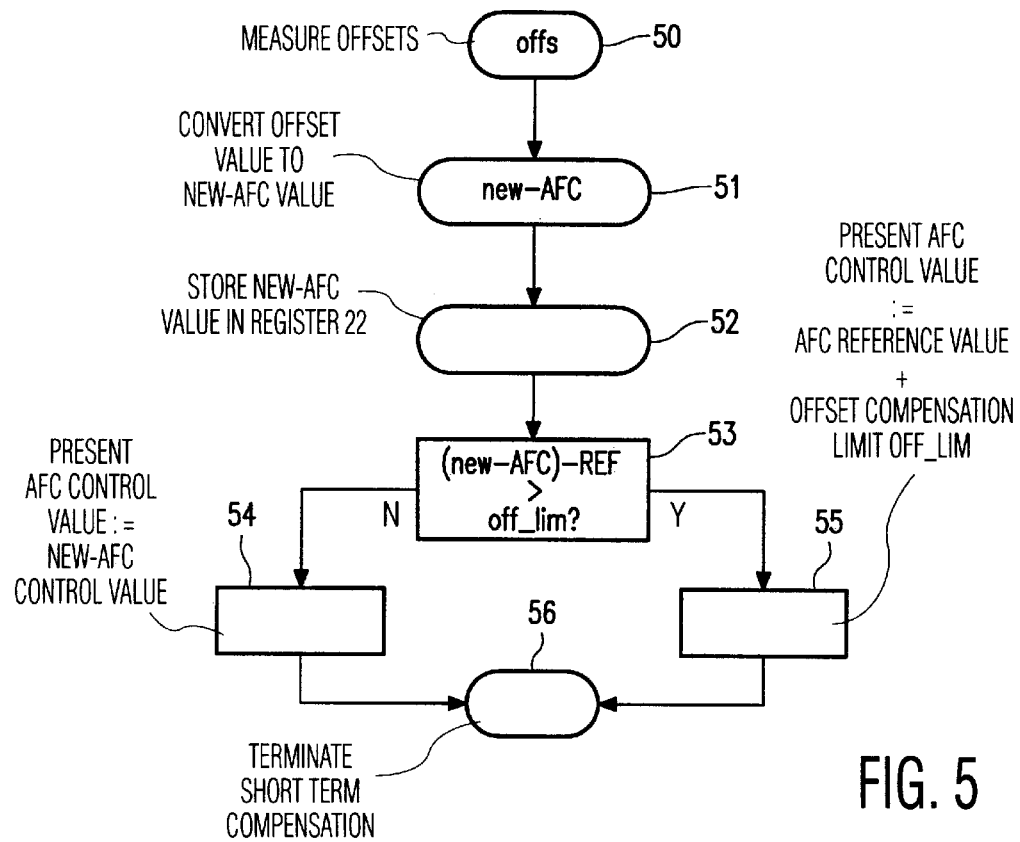
Figure 6:
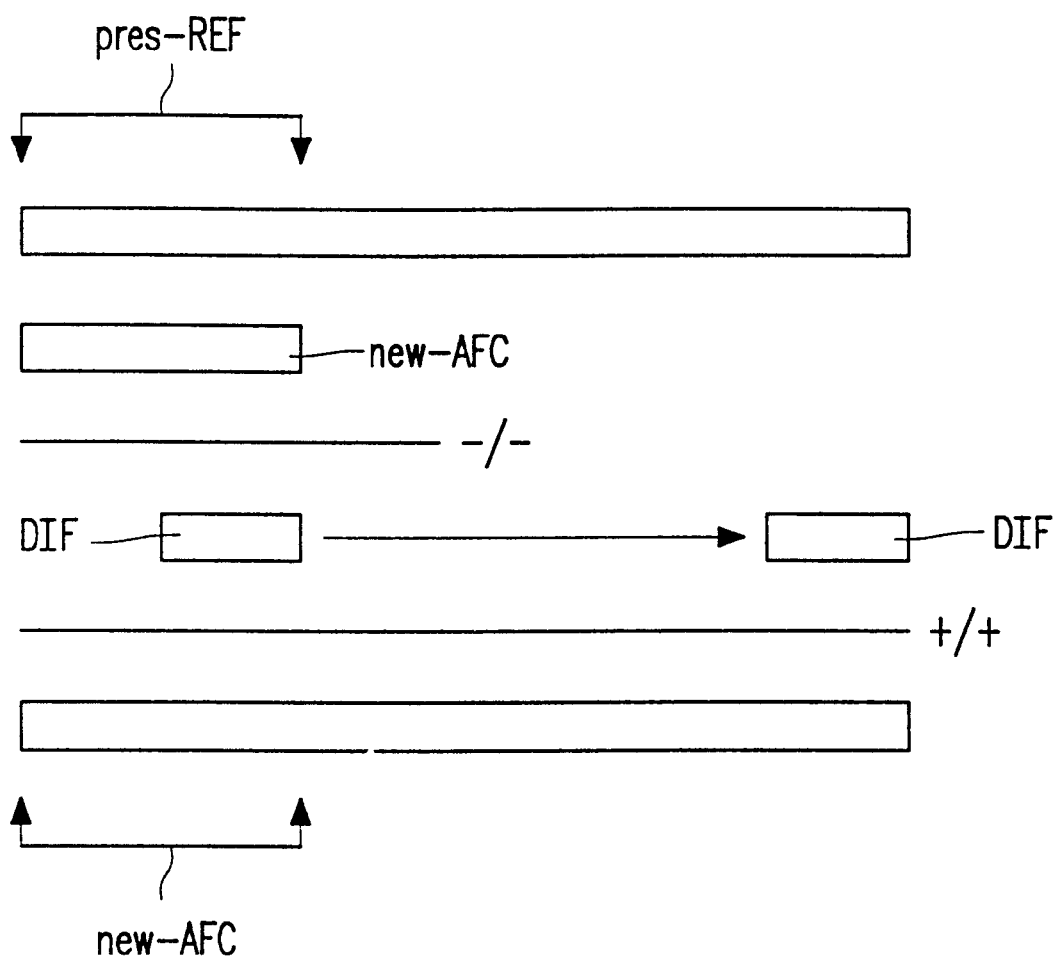

The present invention will now be described, by way of example, with reference to the accompanying drawings, wherein FIG. 1 schematically shows a functional block diagram of a digital communication device according to the present invention, FIG. 2 shows a mixed hardware/software implementation of frequency adjustment according to the present invention, FIG. 3 shows a frequency offset diagram as a function of time so as to illustrate the operation of the frequency adjustment, FIG. 4 shows a flow-chart for long term offset compensation, FIG. 5 shows a flow-chart for short term offset compensation, and FIG. 6 shows registers to further illustrate the operation of the frequency adjustment.

Throughout the figures the same reference numerals are used for the same features.

DETAILED DESCRIPTION

FIG. 1 schematically shows a functional block diagram of a digital communication device 1 according to the present invention. The digital communication device 1 comprises an antenna 2 coupled to a receiver having a mixer. Such a structure of a communication device is well-known and is not shown in detail here. The digital communication device 1 further comprises a local oscillator 3 as a local frequency generating arrangement coupled to the mixer in the reception path. A demodulator 4 is coupled to an output of the mixer (not shown). The local frequency generating arrangement can be any other suitable arrangement such as a controlled synthesizer or the like. Preferably quadrature demodulation is done so that quadrature signals I and Q are available. The demodulator 4 provides demodulated data data and a frequency offset value offs. Such a demodulator 4 is well-known per se. The frequency offset value offs is a difference between a frequency value representative of an output frequency of the local oscillator 3 and a frequency value representative of a desired tuning frequency. In the event the digital communication device is a selective pager, such a pager can be tuned to a particular channel. It should be prevented that the pager or any other suitable digital communication device would tune to an undesired neighbouring channel. Such a situation could occur when a frequency adjustment loop would not function properly. According to the present invention a very robust frequency adjustment loop (Automatic Frequency Adjustment AFC) is provided, particularly eliminating long term drift effects caused by aging, for instance, but also eliminating short term drift effects caused by short term temperature variations, for instance. Such an AFC is done by separating long term and short term frequency drift. Frequency adjustment means are provided comprising a frequency adjustment reference value REF which is updated in accordance with the separated long term frequency drift. Separation is done in a microcontroller 5 having RAM, EEPROM and ROM memory, and registers, by separate averaging of the measured frequency offset value offs. The structure of such a microcontroller is well-known and is not shown in detail here. Short term averaging is done in process block 6 and long term averaging is done in block 7, on a minute and a month basis, for instance. The respective averaging results are combined in combining block 8. For obtaining a proper AFC initial value initial alignment is done in the factory by inserting an alignment value ALGN in the combining block 8. Preferably, alignment is done such that the AFC is set midway the AFC range. Furthermore, the offset is adjusted to zero. Alternatively, alignment can be done by using a software routine achieving that the offset is set to zero without any further manual alignment. An output of the combining block 8 is supplied to a digital-to-analog converter 9 of which an output voltage is fed to a filter 10 comprising a resistor 11, a capacitor 12 and a coil 13. At an other side, the coil 13 is coupled to a junction of a capacitor 14 and a varicap 15, the series arrangement of which being connected parallel to a crystal 16 in the local oscillator 3.

FIG. 2 shows a mixed hardware/software implementation of frequency adjustment according to the present invention. A frequency offset detector 20 is shown which is comprised in the demodulator 4. A register 21 stores a present AFC control value steering the digital-to-analog converter. Any new frequency offset offs detected by the frequency offset detector 20 is supplied to a new AFC control value register 22 after having been converted to an AFC value in the offset-to-AFC-value converter 23. At regular time intervals, the short term compensation loop, indicated with short term compensation block 24, updates the present AFC control value as stored in the register 21. An offset compensation limit as stored in a register 25 is used as an input for this update. The latter value is determined by the particular application and is a fixed value. In a message pager, for instance, the offset compensation limit value could be 2 kHz. The AFC reference value REF as stored in a register 26 and provided by the long term compensation loop, indicated with long term compensation block 27, is used as a second input for updating the present AFC control value as stored in the register 21. The reference value REF represents the aging information as generated by the long term compensation loop. As described, the AFC reference value REF is updated at a very low rate. As an example, assume a present AFC control value of 4 kHz and an actual receiver offset of 3 kHz. Then, the detector 20 detects a new offset offs of −1 kHz. After addition in the adder block 28, the new AFC control value becomes +3 kHz which corresponds to the actual frequency offset of the digital communication device 1. Although the maximum offset compensation range of the short term compensation loop is limited to 2 kHz, it can compensate for 3 kHz because its limit is related to the AFC reference value REF. In the example given, a long term offset of +2.5 kHz is assumed to have been detected over a large period, a couple of months, for instance.

FIG. 3 shows a frequency offset diagram as a function of time t so as to illustrate the operation of the frequency adjustment. The frequency offset offs, shown in ppm, caused by aging is according to the curve 30. Just below the curve 30 an updated reference value REF is shown as a function of the time t. Further shown are a positive offset compensation limit curve 31 and a negative offset compensation limit curve. As can be seen, according to the present invention, full positive and negative compensation ranges R1 and R2 are available in the course of time. The AFC reference value REF is stored in RAM. This reference value stored in RAM is copied to EEPROM at regular intervals, once a day, for instance. This is not to loose the long term reference value in the event the supply voltage drops below the RAM retention voltage. Such a situation could occur when changing the supply battery of the digital communication device 1. The compensation range needs to be limited because the receiver could erroneously tune to a strong adjacent channel. Without separated long term/short term offset compensation as according to the present invention, either one of the positive or negative offset ranges would run out of a compensation range in the course of time.

FIG. 4 shows a flow-chart for long term offset compensation. In block 40, the offset offs is measured. In block 41, the measured offset value offs is converted to an AFC value new-AFC. In block 42, the new AFC value new-AFC is stored in the register 22 In block 43 the AFC reference value REF becomes AFC reference value REF+((new-AFC minus AFC reference value)/$2^n$"), n being an integer value. In block 45, the determination of the new long term AFC value is terminated. The above computation is the arithmetic average of the new AFC control value over a long period such as a one month period.

FIG. 5 shows a flow-chart for short term offset compensation. In block 50, the offset offs is measured and in block 51 converted to a new AFC value new-AFC which stored in the register 22 in block 52. In block 53, the stored new AFC control value is subtracted from the AFC reference value REF and the result of this subtraction is compare with an offset compensation limit off_lim. In block 54, the present AFC control value:=the new AFC control value if the comparison result is negative. In block 55, the present AFC control value becomes the sum of the AFC reference value REF and the offset compensation limit off_lim. In block 56, the short term compensation is terminated.

FIG. 6 shows registers to further illustrate the operation of the long term frequency adjustment. The present AFC reference value pres_REF, 6 bit, for instance, is stored as the most significant bits of a long register, 21 bits, for instance. The initial value of pres_REF can be set at factory alignment. The other 15 bits are set to zero at the initial AFC alignment. A 6 bit calculated new average AFC value new_AFC is subtracted from the present AFC value pre_AFC. The difference is added to the least significant part of the 21 bits register. Herewith, the difference DIF divided by $2^{15}$ is added to the reference value so that it will take $2^{15}$ calculations before the average difference is added to or subtracted from the reference value. So, assuming one calculation per minute, it takes 32768 minutes or approximately 23 days before a persistent difference has reached the reference value. During this long period any temperature variations will have been averaged out so that true aging compensation is achieved.

In view of the foregoing it will be evident to a person skilled in the art that various modifications may be made within the spirit and the scope of the present invention as hereinafter defined by the appended claims and that the present invention is thus not limited to the examples provided.

What is claimed is:

1. A digital communication device comprising a receiver having a mixer which is coupled to a local frequency generating arrangement, a demodulator which is coupled to the receiver, a microcontroller which is coupled to the demodulator being arranged for providing a frequency offset value being a difference between a frequency value representative of an output of the local frequency generating arrangement and a frequency value representative of a desired tuning frequency, and frequency adjustment means for adjusting the frequency of the local frequency generating arrangement in dependence of the frequency offset value, the microcontroller being arranged for processing the frequency offset value such that long term frequency drift is separated from short term frequency drift, the frequency adjustment means comprising a frequency adjustment reference value which is updated in accordance with the separated long term frequency drift, the microprocessor being arranged to perform separated short term drift compensation and long term drift compensation, the short term drift compensation being performed on the basis of the separated short term frequency drift and the long term drift compensation being performed on the basis of the frequency adjustment reference value, and the short term drift compensation being performed at first time intervals that are substantially shorter than second time intervals of performing the long term drift compensation.

2. A digital communication device according to claim 1, wherein the frequency adjustment reference value is initially aligned such that the frequency offset becomes zero.

3. A digital communication device according to claim 1, wherein the microcontroller is arranged to determine the short term drift and the long term drift by respective averaging of the frequency offset value over averaging periods of substantially different lengths.

4. A digital communication device according to claim 3, wherein a frequent adjustment control value and the frequency adjustment reference value are related to each other in accordance with a predetermined function.

5. A digital communication device according to claim 2, wherein the microcontroller is arranged to determine the short term drift and the long term drift by respective averaging of the frequency offset value over averaging periods of substantially different lengths.

6. A digital communication device according to claim 5, wherein a frequency adjustment control value and the frequency adjustment reference value are related to each other in accordance with a predetermined function.

7. A digital receiver comprising:
 a local oscillator providing a local oscillator signal;
 a frequency offset detector configured to provide a frequency offset signal that is representative of a difference between the local oscillator signal and a desired tuning frequency of the digital receiver;
 a frequency controller controlling the frequency of the local oscillator on the basis of a stored control value, the frequency controller being configured to separately derive a short term drift compensation signal and a long term drift compensation signal from the frequency offset signal, to at a first interval update the stored control value on the basis of the derived short term drift compensation signal, and to at a second interval update the stored control value on the basis of the long term drift compensation signal, the first interval being substantially shorter than the second interval.

8. A digital receiver as claimed in claim 7, wherein the long term drift compensation signal is a function of a frequency control reference value and a currently measured frequency offset signal, the digital receiver comprising a register storing the frequency control reference value.

9. A digital receiver as claimed in claim 8, wherein the function is determining a new frequency control reference value from the currently measured frequency offset signal, subtracting from most significant bits of the stored frequency control reference value the new frequency control reference value, and adding a difference of the subtracted stored and new frequency control reference values at least significant bit positions of the register.

10. A digital receiver as claimed in claim 8, wherein the short term drift compensation signal is proportional to the currently measured frequency offset signal if a difference between a frequency signal proportional to the currently measured frequency offset signal and the stored frequency control reference signal is within an offset compensation limit, and is the sum of the stored frequency control reference signal and the offset compensation limit if the difference between a frequency signal proportional to the currently measured frequency offset signal and the stored frequency control reference signal is outside the offset compensation limit.

* * * * *